United States Patent [19]
Watanabe et al.

[11] Patent Number: 5,397,748
[45] Date of Patent: Mar. 14, 1995

[54] METHOD OF PRODUCING SEMICONDUCTOR DEVICE WITH INSULATING FILM HAVING AT LEAST SILICON NITRIDE FILM

[75] Inventors: Hirohito Watanabe; Sadayuki Ohnishi, both of Tokyo, Japan

[73] Assignee: NEC Corporation, Tokyo, Japan

[21] Appl. No.: 996,978

[22] Filed: Dec. 24, 1992

[30] Foreign Application Priority Data

Dec. 28, 1991 [JP] Japan ................................ 3-360582
Aug. 21, 1992 [JP] Japan ................................ 4-222579

[51] Int. Cl.$^6$ ............................................ H01L 21/02
[52] U.S. Cl. .................... 437/239; 437/238; 437/52; 437/919; 148/DIG. 14
[58] Field of Search .............. 437/238, 52, 239, 919; 148/DIG. 14

[56] References Cited
FOREIGN PATENT DOCUMENTS

0018677 1/1984 Japan ................................ 437/238

OTHER PUBLICATIONS

"Formation of PZT Films by MOCVD" by K. Kashihara et al., International Conference on Solid State Devices and Materials, Yokohama, 1991.
"The Reliability of Trench Capacitors with O-N Double-Layer Films", Ohno et al., Mitsubishi Electric Corp., Technical Report of the Electronic Information and Communication Society of Japan.
Fukuda et al., "High-Performance Scaled Flash-Type EEPROMs with Heavily Oxynitrided Tunnel Oxide Films", IEDM 1992, pp. 17.6.1–17.6.4.

*Primary Examiner*—Brian E. Hearn
*Assistant Examiner*—Trung Dang

[57] ABSTRACT

A thermal oxidation method for producing a semiconductor device having a capacitor insulating film structure capable of making a thin film having a small leakage current and small temperature dependence of the leakage current. In the insulating film, a silicon nitride film with a small electron mobility and a silicon oxide film with a small hole mobility are alternately laminated in order of the nitride film/oxide film/nitride film/oxide film from a lower electrode side. A current component such as electrons flowing in this insulating film structure is limited by the layer with the smaller mobility to reduce the leakage current. An oxide film thickness of approximately several Å can thus be strictly controlled. By forming the silicon nitride film between the high dielectric oxide film and the electrode, the reaction of the silicon electrode and the high dielectric oxide film can be prevented.

1 Claim, 11 Drawing Sheets

ELECTRIC FIELD (MV/cm)
GATE POSITIVE BIAS

ELECTRIC FIELD (MV/cm)
GATE NEGATIVE BIAS

F I G. 11
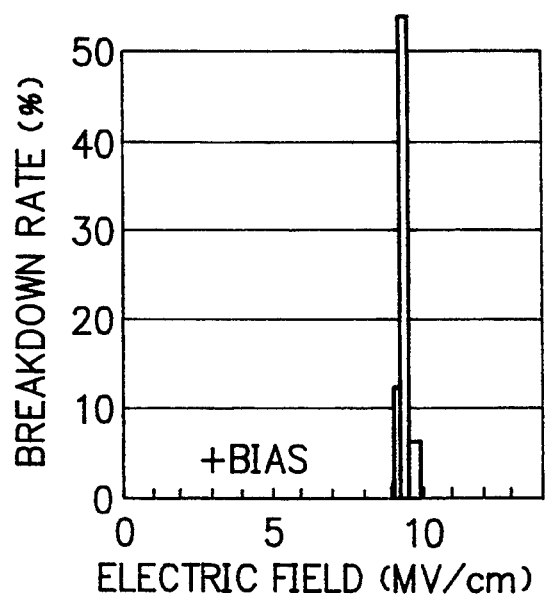
F I G. 12
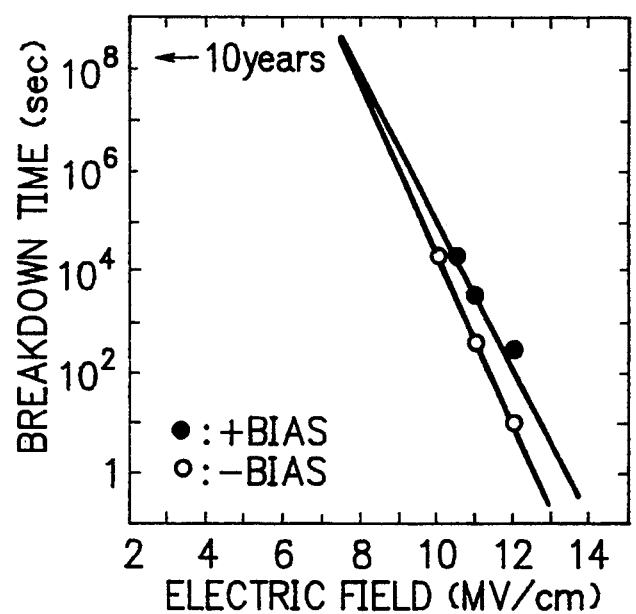

METHOD OF PRODUCING SEMICONDUCTOR DEVICE WITH INSULATING FILM HAVING AT LEAST SILICON NITRIDE FILM

BACKGROUND OF THE INVENTION

The present invention relates to a semiconductor device and a method for producing thereof, and more particularly to an insulating film used for a semiconductor device and a producing method thereof.

DESCRIPTION OF THE PRIOR ART

Recently, with high integrating of DRAMs, it has been intended to reduce a cell size and a capacitor area. In order to ensure sufficient capacitance, a stacked capacitor or a trench stacked capacitor having a large capacitor area and α-ray resistance and small interference between capacitors is used. However, in a 64 Mbit DRAM, a cell area is estimated to be 1.5 $\mu m^2$, and, even when such a capacitor structure as mentioned above is used, less than 50 Å (angstrom) of oxide equivalent thickness as a insulating film is required. In order to satisfy this requirement, the reduction in the thickness of the insulating film composed of $SiO_2$ and $SiO_2$ and $Si_3N_4$ and a device application research of a high dielectric film have been positively examined.

Recently, in the application of the insulating film composed of $SiO_2$ and $Si_3N_4$, it has been reported that a uniform $SiO_2/Si_3N_4$ two layer dielectric film was fabricated by the thermal oxidation of silicon nitride film deposited on silicon electrodes by LPCVD method. In the reported paper entitled "Reliability of ON film Trench Capacitor" in the technical report (SDM88-43) OF THE Electronic Information and Communication Society of Japan, the high reliability of this film can be shown.

Further, when a high dielectric film and a strong dielectric film are applied to a storage capacitor, a non-oxidation electrode such as Pt is used as the bottom electrode in order to prevent the formation of a low dielectric rate layer on the electrode surface. An actual example of this is reported in the paper entitled "Formation of PZT films by MOCVD", Solid State Devices and Materials, 1991, pp. 192-194.

It is possible to form the uniform insulating film having the oxide equivalent thickness of approximately 50 Å by the $SiO_2/Si_3N_4$ two layer film fabricated by the thermal oxidation of the silicon nitride film directly formed on the silicon electrode by the LPCVD method. However, when making a thin film having an oxide equivalent thickness of approximately 40 Å, the leakage current is increased and consequently it becomes difficult to perform the device application. About this fact, there is a reported paper entitled "Inter-Poly $SiO_2/Si_3N_4$ Capacitor Films 5 nm Thick for Deep Submicron LSIs", Solid State Devices and Materials, 1988, pp. 173-176. Further, even when the leakage current is low at room temperature, the leakage current can be increased at a device operation temperature of 120° C.

Further, although a method of applying the non-oxidation electrode such as Pt to the bottom electrode is used when the high dielectric film and the strong dielectric film are applied to the capacitor, a processing of the electrode is very difficult.

SUMMARY OF THE INVENTION

It is therefore an object of the present invention to provide an insulating film structure and its producing method in order to remove the aforementioned demerits of the prior art, and to realize an insulating film with low leakage current and low temperature dependence of leakage current.

It is another object of the present invention to remove the aforementioned demerits of the prior art, and to provide a preventing method of the oxidation of the electrode surface in the formation of the insulating film including an oxide film, such as the high dielectric film.

In accordance with one aspect of the present invention, there is provided a semiconductor device, comprising: a lower electrode; an upper electrode; and an insulating film interposed between the lower electrode and the upper electrode, the lower electrode, the insulating film and the upper electrode constituting a capacitor, the insulating film being a multi-layer insulating film including a silicon nitride film and a silicon oxide film alternately stacked in at least four layers.

In accordance with another aspect of the present invention, there is provided a method of producing a semiconductor device including an insulating film having at least a silicon nitride film, comprising the steps of: forming a silicon nitride film on a substrate; and performing an oxidation treatment of the substrate having the silicon nitride film in an oxygen atmosphere positively excluding hydrogen and water to form a thin oxide film on the silicon nitride film.

In accordance with still another aspect of the present invention, there is provided a producing method of a semiconductor device, comprising the steps of: forming a silicon nitride film on a silicon electrode; and forming an insulating film including an oxide of high dielectric on the silicon nitride for preventing oxidation of the silicon electrode.

The present inventor has found that, in case that a silicon nitride film having a small oxygen concentration is oxidized in oxygen ambient in which hydrogen and water are not positively added, even when the oxidation treatment is carried out for 5 hours at 800° C., an oxide film can not be formed on the silicon nitride film in thickness of more than 20 Å and a uniform and thin film can be formed. Since this process can uniformly form the extremely thin oxide film on the nitride film, it is very much effective for reduction of the defects of an insulating film. Further, in this process, an $SiO_2/Si_3N_4$ two-layer film having a thickness of approximately 20 Å can be readily formed.

Further, the oxide film as a barrier of holes and the nitride film as a barrier of electrons are alternately laminated in four layers to form the four-layer dielectric film of the oxide equivalent thickness of approximately 40 Å. As a result of its electric measurement, the following effects can be confirmed.

(1) When the silicon oxide film with a small hole mobility and the silicon nitride film with a small electron mobility are alternately laminated in at least four layers, the current component such as the electrons or holes flowing in this structure is limitted by the layer with the smaller mobility.

Hence, a carrier mobility for contributing the Poole-Frenkel conduction as a leakage current component of the nitride film is started to fall and the Poole-Frenkel component is reduced to reduce the leakage current. As described in (1), by laminating insulating films in at least four layers, a trap level for contributing the Poole-Frenkel conduction becomes shallow, and thus the temperature dependence of the leakage current is reduced.

As described above, the present inventor has found that, in case that the silicon nitride film having the small oxygen concentration is oxidized in oxygen ambient in which the hydrogen and the water are not positively added, even when the oxidation treatment is carried out for 5 hours at 800° C., the oxide film can not be formed on the nitride film in thickness of more than 20 Å and the uniform and thin film can be formed. Hence, by forming a silicon nitride film between a silicon electrode and an insulating material containing a kind of an oxide, a formation of an oxide film on the silicon electrode can be prevented. By using this process, there is no need to use the electrode which is difficult to process such as Pt as a high dielectric film electrode.

BRIEF DESCRIPTION OF THE DRAWINGS

The objects, features and advantages of the present invention will become more apparent from the consideration of the following detailed description, taken in conjunction with the accompanying drawings, in which:

FIG. 11 is a graphical representation showing an breakdown voltage distribution characteristic of the ONON four-layer structure insulating film according to the present invention;

FIG. 12 is a graphical representation showing an electric field dependence of a 50% time to breakdown of the ONON four-layer structure insulating film according to the present invention;

DESCRIPTION OF THE PREFERRED EMBODIMENTS

Figure 1:
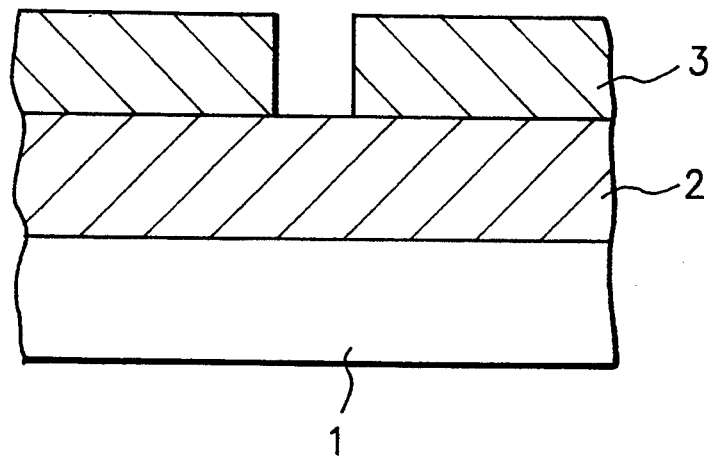
FIGS. 1 to 8 are cross sectional views showing the steps of a producing method of an insulating film according to the present invention.

Referring now to the drawings, wherein like reference characters designate like or corresponding parts throughout the views and thus the repeated description thereof can be omitted for brevity, the first embodiment of a present invention, that is, a producing method of a multi-layer insulating film according to the present invention with respect to a stacked capacity electrode having a simple cubic structure will now be described in connection with FIGS. 1 to 8.

Figure 2:
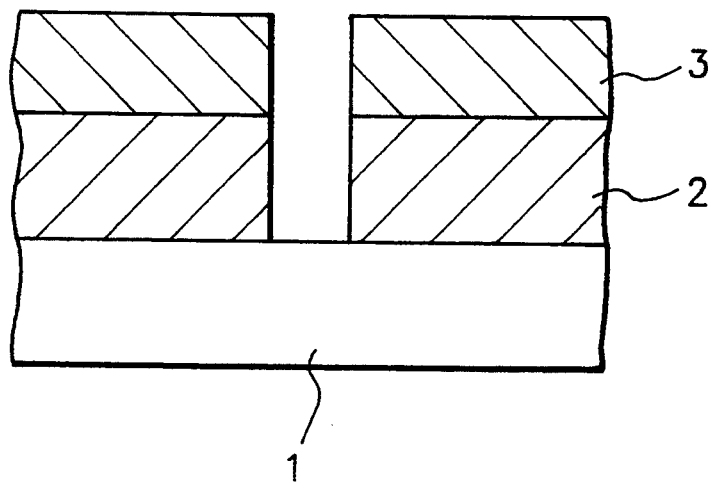
Figure 3:
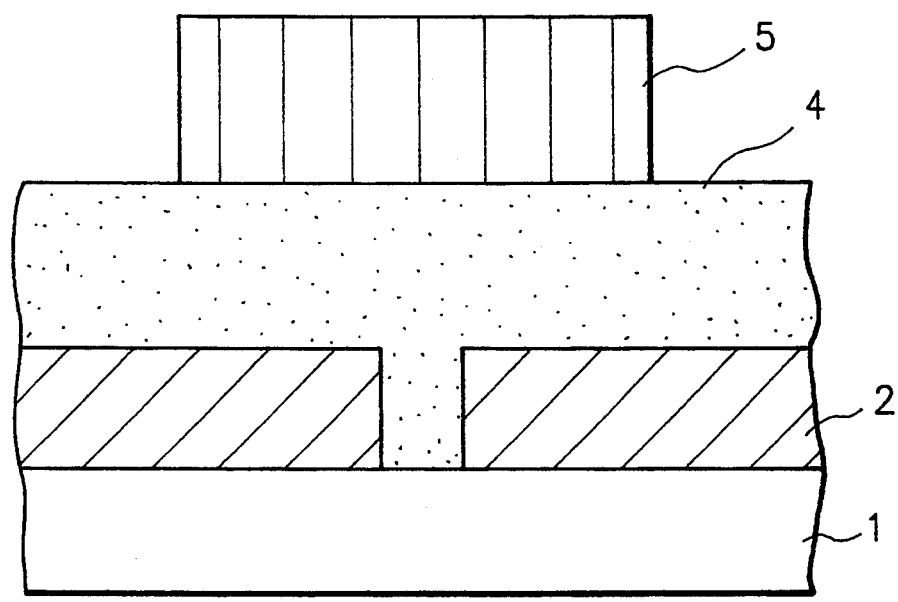
Figure 4:
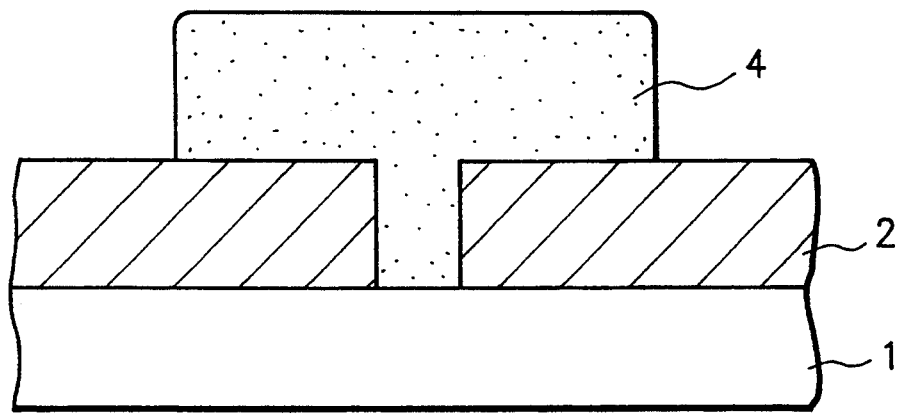

First, as shown in FIG. 1, an oxide film 2 is formed on a silicon (Si) substrate 1 and a resist 3 is coated on the oxide film 2 to carry out a patterning of the resist 3. In FIG. 2, by using the dry etching, the oxide film 2 is etched. Then, a polysilicon 4 doped with phosphor is deposited in thickness of 2000 Å on the surface of the etched substrate 1 by using a $Si_2H_6$ gas (150 cc/min) and a 4% of $PH_3$ + a 96% of He gas (480 cc/min) at 0.2 Torr by LPCVD method. On the polysilicon film 4, a resist 5 is applied to make a patterning of the resist 5, as shown in FIG. 3, and by using the patterned resist 5 as a mask, the polysilicon film 4 is dry-etched to form a lower electrode, as shown in FIG. 4.

Figure 5:
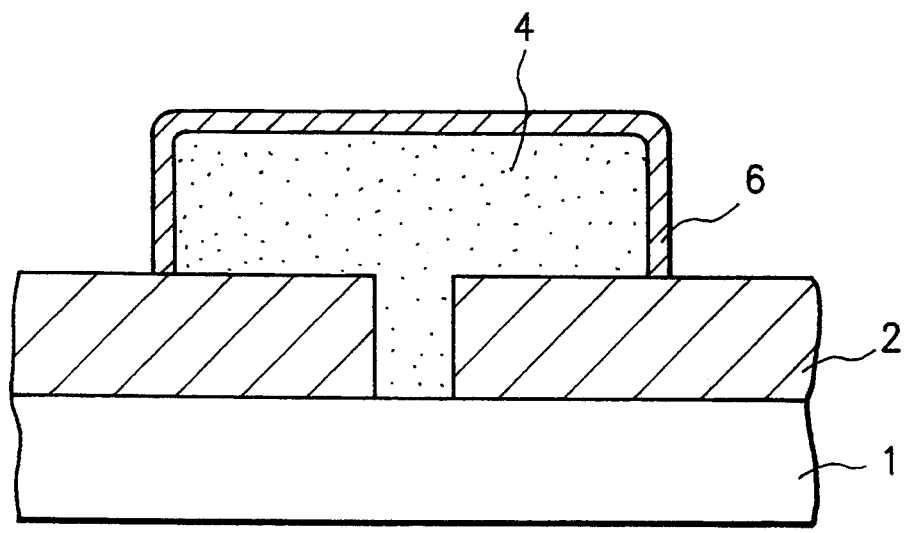
Figure 6:
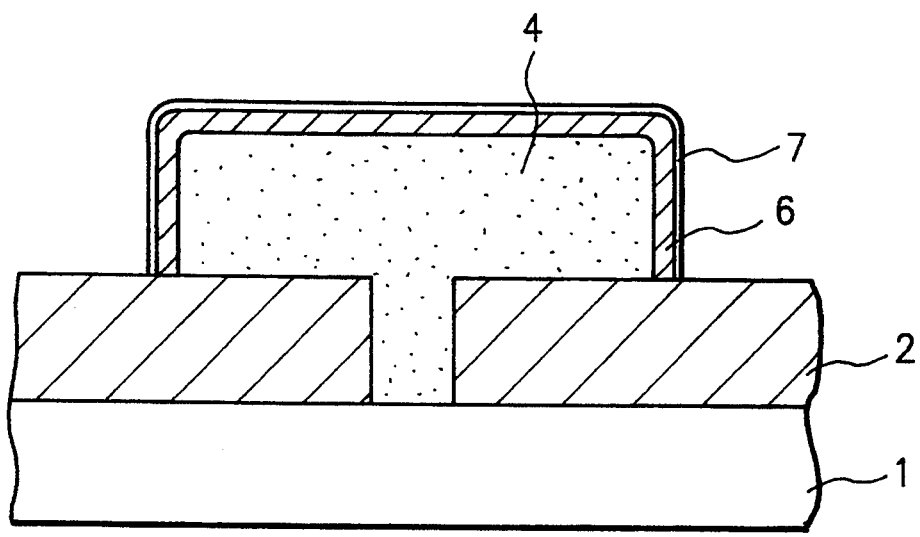

After removing the resist 5, an HF processing is applied to the substrate to remove a native oxide and then flowing an ammonia gas in a flow amount of 1000 cc/min into a lamp heating apparatus, the substrate is thermally treated for 30 seconds at 850° C. to form a silicon nitride film 6 having a thickness of 15 Å on the silicon electrode, as shown in FIG. 5. In this embodiment, although the thermal nitridation is used, any silicon nitride film formed by any method can be used. Next, in an oxidation furnace, an oxidation treatment of the substrate is performed for 10 minutes at 800° C. under a condition of an oxygen flow amount of 10000 cc/min to form a uniform silicon oxide film 7 with a thickness of approximately 10 Å over the silicon nitride film 8, as shown in FIG. 6.

Figure 7:
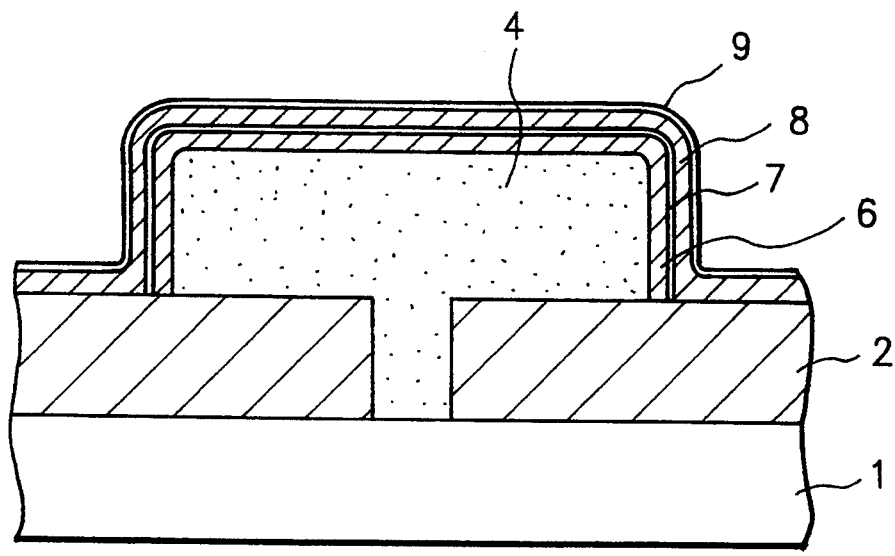

Then, on the $SiO_2/Si_3N_4$ two layer film, a silicon nitride film 8 is deposited with a thickness of 30 Å by LPCVD method. Next, an oxidation treatment of the substrate is performed for 30 minutes at 800° C. under conditions of an oxygen flow amount of 5 l/min and a hydrogen flow amount of 5 l/min to form a uniform silicon oxide film 9 with a thickness of about 10 Å, as shown in FIG. 7.

Figure 8:
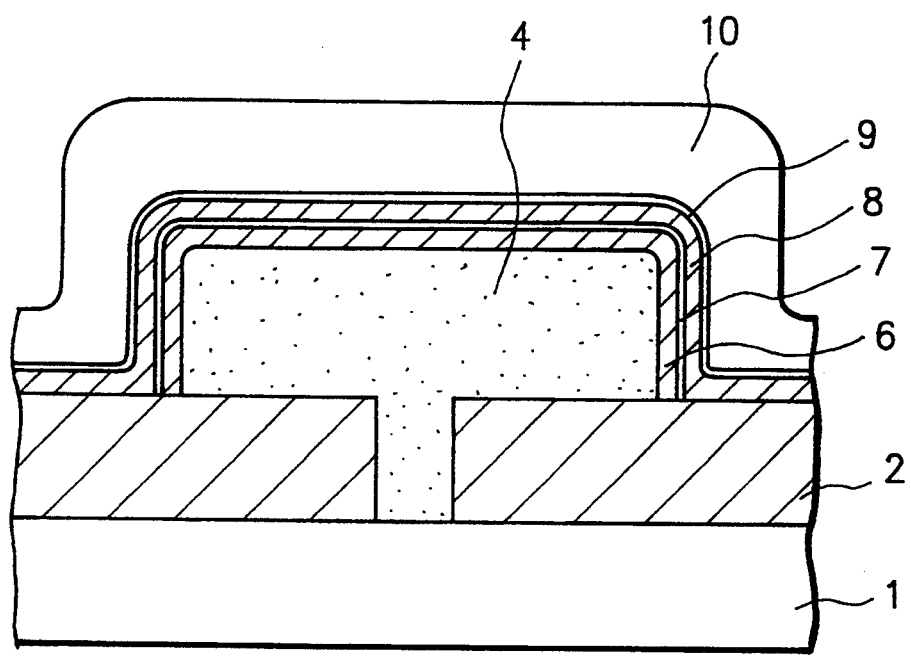

Then, a polysilicon doped with phosphor as an upper electrode 10 is deposited in thickness of 2000 Å over the silicon oxide film 9 by using the $Si_2H_6$ gas (150 cc/min) and the 4% of $PH_3$ + the 96% of He gas (480 cc/min) at 0.2 Torr by the LPCVD method, and an electrode processing is carried out to form the upper electrode 10, as shown in FIG. 8.

As described above, a $SiO_2/Si_3N_4/SiO_2/Si_3N_4$ (ONON) four-layer film with oxide equivalent thickness of 45 Å is formed. For making a comparison, a $SiO_2/Si_3N_4$ (ON) two-layer film with oxide equivalent thickness of 45 Å is also formed by the following method. That is, after a thermal nitridation of a silicon eletrode, a silicon nitride film is deposited thereon by the LPCVD method to obtain a silicon nitride film with a total thickness of 60 Å. Then, an oxidation treatment is performed for 30 minutes at 800° C. under conditions of an oxygen flow amount of 5 l/min and a hydrogen flow amount of 5 l/min to form an ON two-layer film.

Figure 9A:
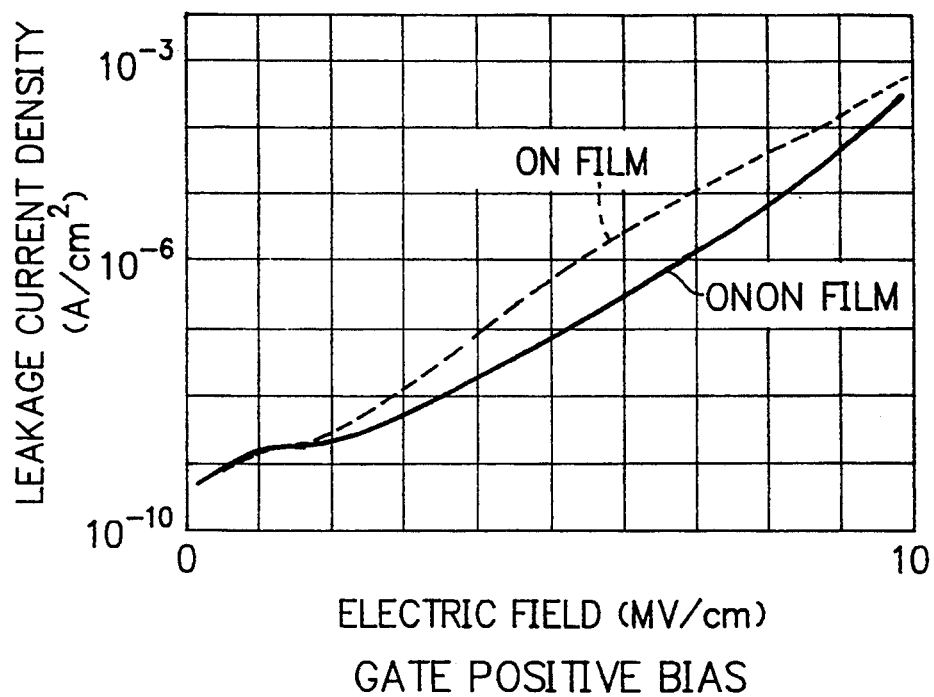
FIGS. 9a and 9b are graphical representations showing leakage current characteristics of ONON four-layer structure insulating films according to the present invention.
Figure 9B:
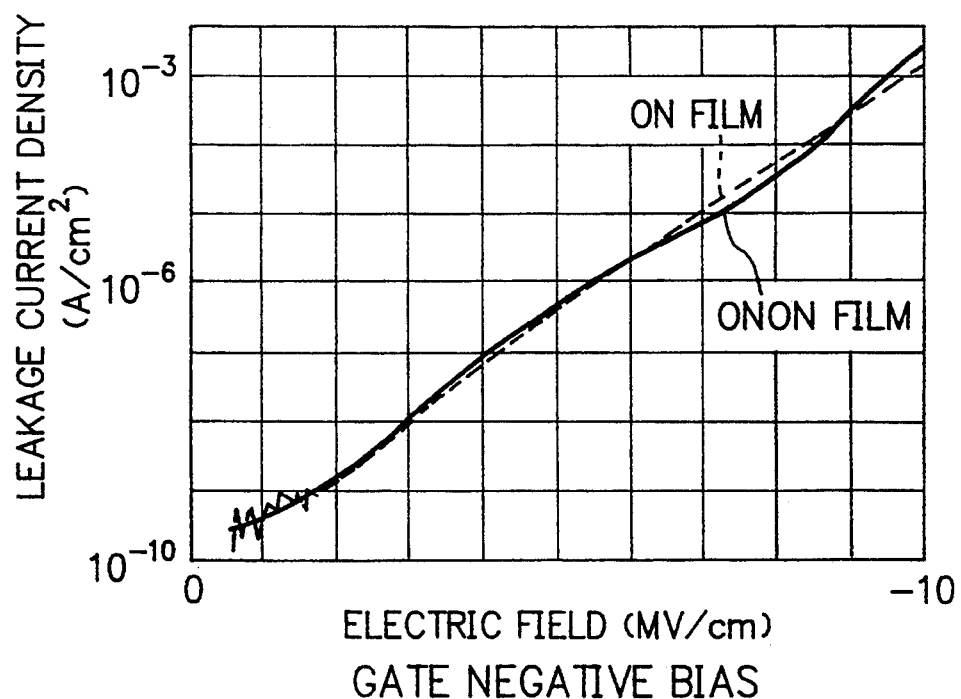

FIGS. 9a and 9b show a leakage current charactristics of the ONON four-layer film of oxide equivalent thickness of 45 Å, as shown by solid curves, in comparison with the ON two-layer film with an equal film thickness, as shown by broken curves. From FIGS. 9a and 9b, it is readily understood that by forming the four-layer film, the leakage current can be reduced. Also, the leakage current reduction is remarkably occurred in a positive gate bias. Hence, when this is used for a memory, an average storage charge holding time is increased at least 5 times, and thus a DRAM refresh cycle can be elongated.

Figure 10:
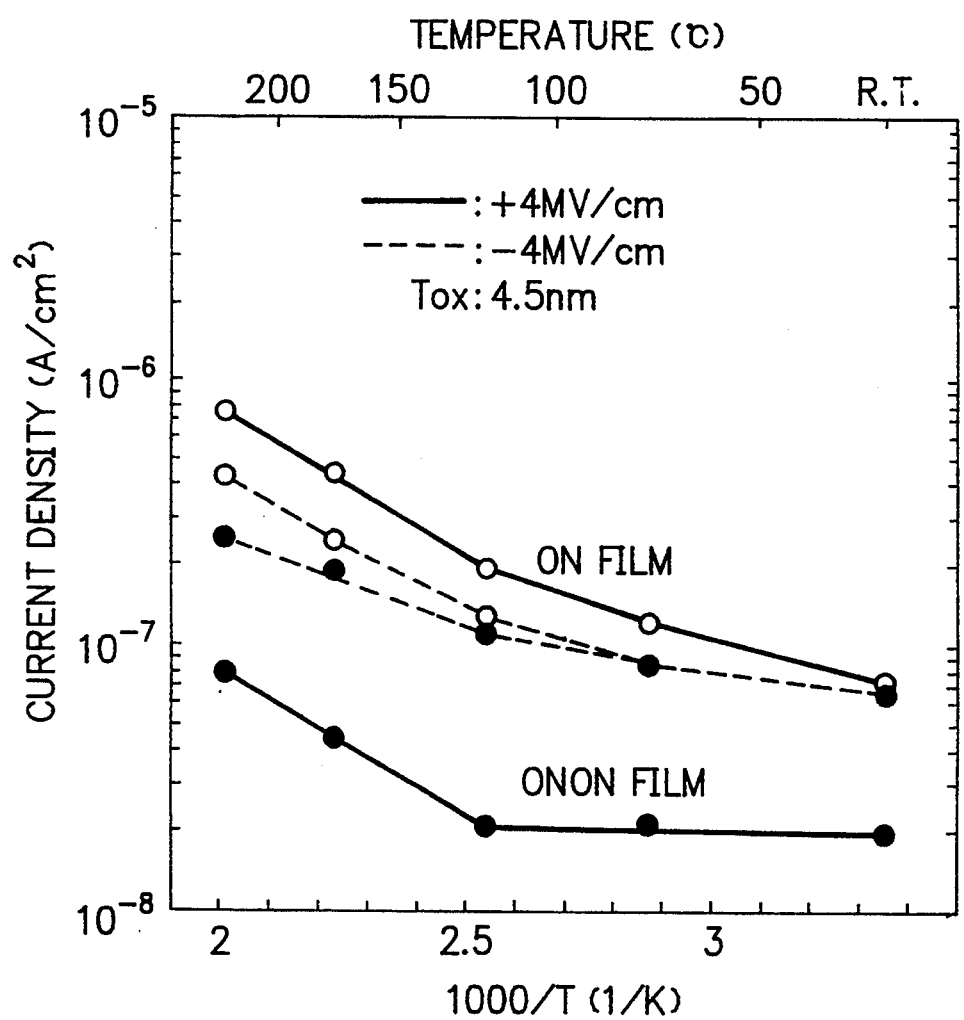
FIG. 10 is a graphical representation showing a temperature dependence of a leakage current of the ONON four-layer structure insulating film according to the present invention.

FIG. 10 shows the temperature dependence of the leakage current of the ONON four-layer film. Concerning the ON two-layer film, with the increase of the temperature, the leakage current increases. However, as to the ONON four-layer film, the leakage current hardly increases up to 120° C. and starts to increase beyond 120° C. The leakage current density at 120 ° C. reaches to $1\times10^{-8}$ A/cm$^2$ when the positive and negative biases are $+1.60$ V and $-1.26$ V, respectively, in the ONON four-layer film in comparison with $+1.13$ V and $-1.21$ V, respectively, in the ON two-layer film.

FIG. 11 shows a breakdown voltage distribution of the ONON four-layer film with oxide equivalent thickness of 45 Å, formed in a pattern including 25000 numbers of 2 μm square stack capacitors. In this case, it is readily understood that, even when the ONON four-layer film is actually applied to a stacked capacitor, a problem such as an initial failure will not be caused.

FIG. 12 shows electric field dependence of a 50% breakdown (T50) of the ONON four-layer film with time to oxide equivalent thickness of 45 Å, obtained by constant voltage TDDB (time dependent dielectric breakdown) measurement. From this, it is readily understood that the ONON four-layer film has a life of at least 10 years at a DRAM operation voltage of 1.5 V and has high reliability with device applicability.

The second embodiment of the present invention, that is, a similar producing method of a insulating film according to the present invention to the first producing method described above with respect to a simple plane structure will now be described in connection with FIGS. 13 to 16.

Figure 13:
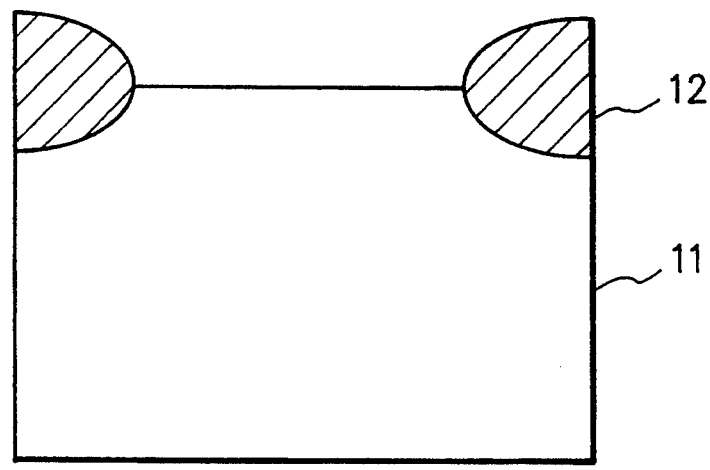
FIGS. 13 to 16 are cross sectional views showing the steps of a producing method of another insulating film according to the present invention.
Figure 14:
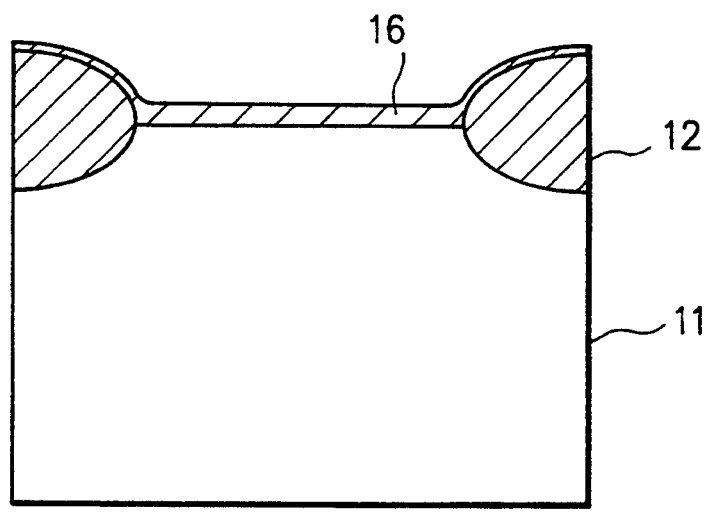
Figure 15:
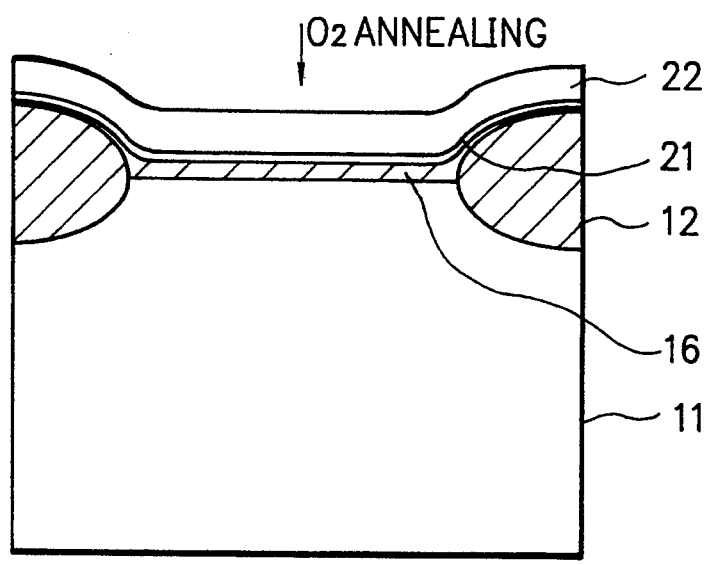
Figure 16:
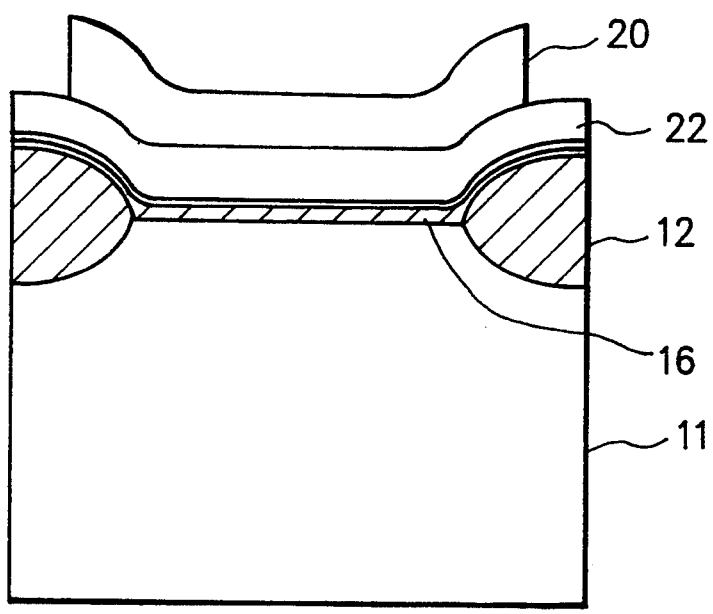

First, as shown in FIG. 13, a silicon oxide film 12 is formed on a silicon substrate 11 to perform an LOGOS device isolation. Then, an HF processing is applied to the substrate to remove native oxide film, and then flowing an ammonia gas in a flow amount of 1000 cc/min into a lamp heating apparatus, the substrate is thermally treated for 30 seconds at 850 ° C. to form a silicon nitride film 16 having a thickness of 15 Å on the surface of the substrate, as shown in FIG. 14. Next, in order to form a SrTiO$_3$ film 22 having a dielectric constant of 200 on the surface of the substrate, the substrate is put into a vapor deposition chamber and the chamber is evacuated. At this time, an ultimate vacuum is $1\times10^{-7}$ torr. In this state, the substrate is heated to 600 ° C. and an oxygen gas is flown in so that a total pressure may be $1\times10^{-3}$ Torr. Next, Ti and Sr are deposited on the Si$_3$N$_4$ film 16 to form the SrTiO$_3$ film 22 having a thickness of 1000 Å thereon. At this time, Ti is evaporated by using an electron gun and Sr is evaporated by heating a K-cell to 370° C. In this case, since there exists a high density of oxygen defects in the SrTiO$_3$ film 22 after this process, the specimen is introduced into an oxidation furnace and an oxidation treatment is executed for 30 minutes at 700° C., as shown in FIG. 15. In this embodiment, the silicon nitride film 16 can effectively act as a protective layer for preventing the silicon substrate electrode from the oxidation in the oxygen atmosphere during the deposition of the SrTiO$_3$ film 22 and in a oxidation treatment after the formation of the SrTiO$_3$ film 22. Next, an upper electrode 20 of a TiN electrode is formed over the SrTiO$_3$ film 22 by sputtering, as shown in FIG. 16.

Figure 17:
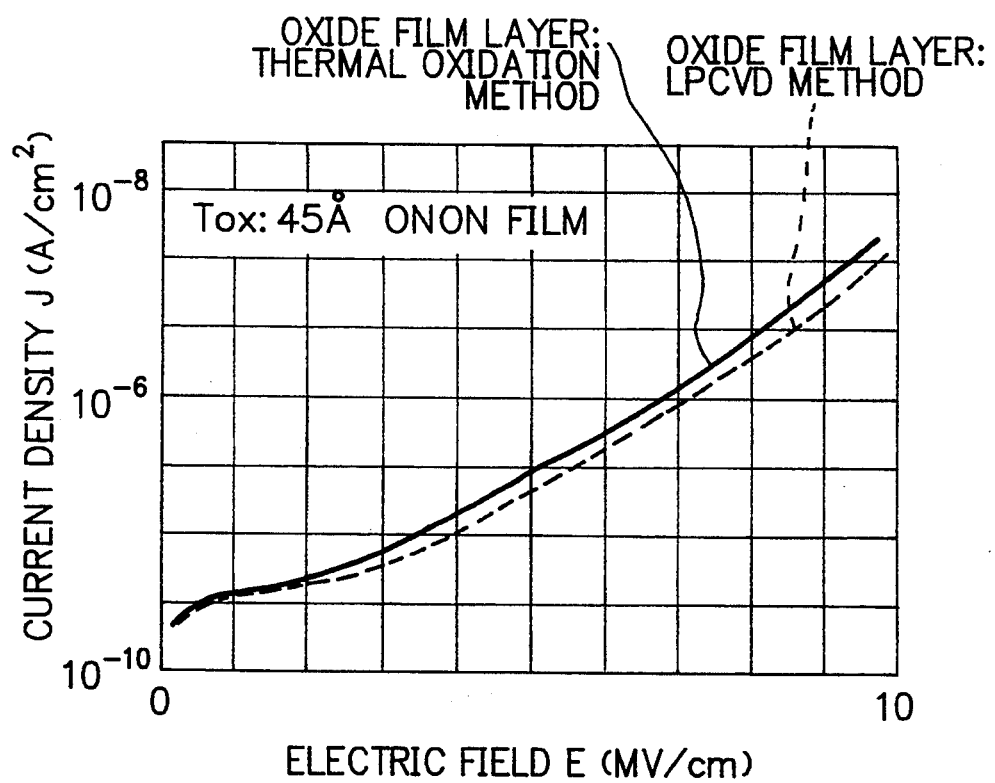
FIG. 17 is a graphical representation showing a leakage current characteristic of another ONON four-layer structure insulating film different from one prepared by a silicon oxide film method according to the present invention.
Figure 18:
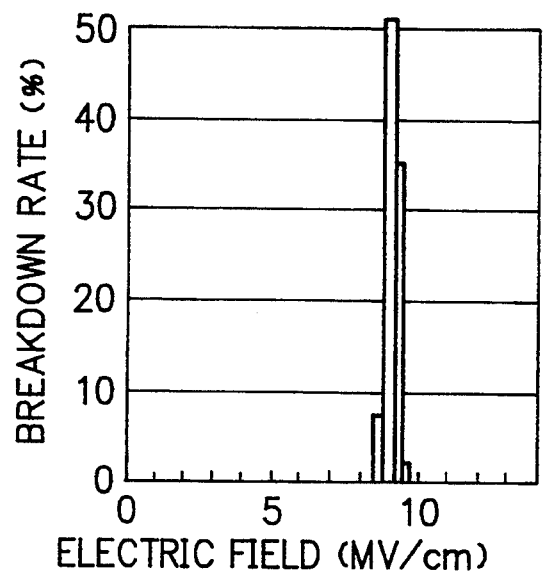
FIG. 18 is a graphical representation showing an breakdown voltage distribution characteristic of another ONON four-layer structure insulating film according to the present invention.
Figure 19:
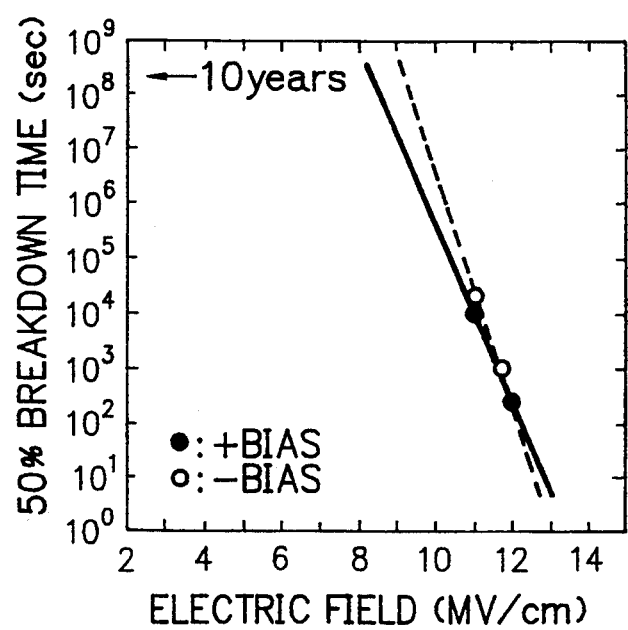
FIG. 19 is a graphical representation showing an electric field dependence of 50% time to breakdown of another ONON four-layer structure insulating film according to the present invention.

Then, the third embodiment of the present invention, that is, another producing method of an ONON four-layer insulating film will now be described and its electric characteristics are shown in FIGS. 17 to 19.

First, in the same manner as the first embodiment described above, a lower silicon electrode is formed. Then, after RCA cleaning of a specimen is carried out, a native oxide film is removed from the specimen by an HF diluted to 1/100 with deionized water, and then flowing an ammonia gas in a flow amount of 2000 cc/min into a lamp heating apparatus, the substrate is thermally treated for 60 seconds at 850 ° C. to form a silicon nitride film having a thickness of 17 Å on the silicon electrode. In this embodiment, although the thermal nitridation is used for forming the silicon nitride film, any silicon nitride film produced by any method can be used. Next, a silicon oxide film having a thickness of 10 Å is deposited on the silicon nitride film by the LPCVD method. This deposition is performed under conditions of a SiH$_4$ flow amount of 100 cc/min, an N$_2$O flow amount of 1000 cc/min at 800 ° C. Then, a silicon nitride film having a thickness of 20 Å and a silicon oxide film having a thickness of 10 Å are successively formed on the surface of the specimen in the same manner as described above to obtain a SiO$_2$/Si$_3$N$_4$/SiO$_2$/Si$_3$N$_4$ four-layer structure film with oxide equivalent thickness of 45 Å.

Then, in the same manner as the first embodiment described above, by depositing a polysilicon doped with phosphor on the four-layer film to carry out an electrode processing to form a stacked capacitor. The electric characteristics of this film are shown as follows.

FIG. 17 shows a leakage current densities of the ONON four-layer film prepared by the LPCVD method (indicated by a broken curve) in the third embodiment in comparison with the one prepared by the thermal oxidation method (indicated by a solid curve) in the first embodiment. It is readily understood that the leakage current of the four-layer film in which the silicon oxide film is formed by the LPCVD method is smaller than the other one. This can be considered that, when the silicon oxide film is formed by the thermal oxidation, the oxygen is also introduced into the silicon nitride film and thus the dielectric constant of the silicon nitride film is reduced to reduce an actual film thickness. In this embodiment, there is no problem in the breakdown voltage distribution characteristic of this film, as shown in FIG. 18, and the long period reliability (at least 10 years at 1.5 V), as shown in FIG. 19.

Next, the fourth embodiment of the present invention, that is, a further producing method of a multi-layer insulating film according to the present invention will now be described.

First, in the same manner as the first embodiment described above, a lower silicon electrode is formed. Then, after RCA cleaning of a specimen is carried out, a native oxide film is removed from the specimen by an HF diluted to 1/100 with deionized water, and the specimen is put into a UHV-CVD apparatus. In this UHV-CVD apparatus, a base pressure is $1\times10^{-11}$ Torr and a source gas is irradiated onto the substrate in the beam form. Also, a multi-layer film formation can be possible at $1\times10^{-3}$ Torr by a CVD method.

After a wafer is introduced via a load lock chamber, the NH$_3$ in a flow amount of 20 cc/min and the SiH$_4$ in a flow amount 1 cc/min are irradiated onto the substrate at a substrate temperature of 700° C. to form a silicon nitride film of a thickness of 20 Å. Then, the temperature is raised to 800 ° C. and the N$_2$O in a flow amount of 40 cc/min and the SiH$_4$ in a flow amount of 1 cc/min are irradiated to the substrate to form a silicon oxide film of a thickness of 10 Å on the silicon nitride film. Next, a silicon nitride film having a thickness of 20 Å and a silicon oxide film having a thickness of 10 Å are successively formed on the surface of the specimen in the same manner as described above to obtain a $SiO_2/Si_3N_4/SiO_2/Si_3N_4$ four-layer structure film. In this embodiment, an oxide equivalent thickness of this film is 40 Å.

In this embodiment, a multi-layer film can be formed without exposing to the air during the formation of multi layer film, and hence a clean interface can be obtained without receiving the influence by forming the native oxide film and contaminating materials. Further, the present invention is effective for thinning of a capacitor dielectric film.

As described above, according to the present invention, by forming a four-layer film composed of a silicon oxide film and a silicon nitride film alternately formed, a leakage current can be reduced and its temperature dependence can be also reduced. Further, there is no problem of an initial failure and a long period reliability to exhibit high reliability. Also, by using thermal oxidation method to form a oxide layer, a thin silicon oxide film can be formed on a silicon nitride film with good controllability. Further, according to a present producing method of an insulating film, there in no need to use a hard processing material such as Pt for a high dielectric film electrode.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A method of producing a semiconductor device including an insulating film having at least a silicon nitride film, the method comprising the steps of:

forming a silicon nitride film on a substrate; and performing an oxidation treatment of the substrate having the silicon nitride film in an oxygen atmosphere positively excluding hydrogen and water to form a thin oxide film on the silicon nitride film, wherein the silicon nitride film forming step and the thin oxide film forming step are alternately performed at least two times to obtain a four-layer insulating film.

* * * * *